US012677653B2

(12) United States Patent
Kim

(10) Patent No.: US 12,677,653 B2
(45) Date of Patent: Jul. 7, 2026

(54) INTERCONNECTION STRUCTURE, SEMICONDUCTOR DEVICE WITH INTERCONNECTION STRUCTURE AND METHOD FOR FABRICATING THE SAME

(71) Applicant: SK hynix Inc., Gyeonggi-do (KR)

(72) Inventor: Jong Su Kim, Gyeonggi-do (KR)

(73) Assignee: SK hynix Inc., Gyeon8gi-do (KR)

( * ) Notice: Subject to any disclaimer, the term of this patent is extended or adjusted under 35 U.S.C. 154(b) by 1029 days.

(21) Appl. No.: 17/671,917

(22) Filed: Feb. 15, 2022

(65) Prior Publication Data

US 2023/0046051 A1     Feb. 16, 2023

(30) Foreign Application Priority Data

Aug. 12, 2021     (KR) ........................ 10-2021-0106594

(51) Int. Cl.
  H10B 12/00     (2023.01)
  H10W 20/00     (2026.01)
    (Continued)

(52) U.S. Cl.
  CPC ....... H10W 20/435 (2026.01); H10W 20/074 (2026.01); H10W 20/085 (2026.01);
    (Continued)

(58) Field of Classification Search
  CPC ........... H01L 23/5283; H01L 21/76808; H01L 21/76816; H01L 21/76829; H01L 23/5226;
    (Continued)

(56) References Cited

U.S. PATENT DOCUMENTS 5,531,022 A     7/1996   Beaman et al.
5,801,094 A     9/1998   Yew et al.
        (Continued)

FOREIGN PATENT DOCUMENTS

CN     103383937 A     11/2013
CN     108198801 A     6/2018
        (Continued)

OTHER PUBLICATIONS

Office Action for Korean Patent Application No. 10-2021-0106594 issued by the Korean Patent Office on Jul. 10, 2025.

(Continued)

*Primary Examiner* — Samuel Park
(74) *Attorney, Agent, or Firm* — IP & T GROUP LLP

(57)     ABSTRACT

Various embodiments of the present disclosure improve integration degree of semiconductor devices by simultaneously forming interconnections extending in various directions through a single gap-fill process. The embodiments of the present invention provide an interconnection structure that is capable of simplifying semiconductor processing, a semiconductor device including the interconnection structure, and a method for fabricating the semiconductor device. According to an embodiment of the present disclosure, an interconnection structure comprises: a stack of a plurality of interconnections, wherein at least two layers of the plurality of interconnections extend in different directions, and a portion of a top surface of a lower interconnection of the at least two layers is in direct contact with a portion of a bottom surface of an upper interconnection of the at least two layers.

14 Claims, 14 Drawing Sheets

(51) Int. Cl.
 *H10W 20/41*   (2026.01)
 *H10W 20/42*   (2026.01)
(52) U.S. Cl.
 CPC ......... *H10W 20/089* (2026.01); *H10W 20/42* (2026.01); *H10W 20/056* (2026.01)
(58) Field of Classification Search
 CPC ............. H01L 21/76877; H01L 23/528; H01L 21/76807; H01L 21/76879; H01L 23/53209
 See application file for complete search history.

(56)      References Cited

U.S. PATENT DOCUMENTS

| | | | | |
|---|---|---|---|---|
| 6,258,707 | B1 | 7/2001 | Uzoh | |
| 7,227,266 | B2 | 6/2007 | Wang | |
| 11,176,308 | B1 * | 11/2021 | Widiger | G06F 30/398 |
| 2013/0181297 | A1 * | 7/2013 | Liaw | H10D 86/215 |
| | | | | 257/E27.099 |
| 2018/0358345 | A1 | 12/2018 | Qian et al. | |
| 2021/0005549 | A1 * | 1/2021 | Zhu | H01L 21/76885 |
| 2022/0336365 | A1 * | 10/2022 | Lee | H01L 24/02 |

FOREIGN PATENT DOCUMENTS

| | | |
|---|---|---|
| KR | 10-2020-0011069 A | 2/2020 |
| KR | 10-2020-0029835 A | 3/2020 |
| TW | 201814835 A | 4/2018 |
| TW | 201836112 A | 10/2018 |

OTHER PUBLICATIONS

Office Action for Taiwanese Patent Application No. 111122481 issued by the Taiwanese Patent Office on Feb. 25, 2026.

China National Intellectual Property Administration, Office Action in Chinese Patent Application No. 202210692897.3, issued Mar. 31, 2026, 9 pages.

* cited by examiner

INTERCONNECTION STRUCTURE, SEMICONDUCTOR DEVICE WITH INTERCONNECTION STRUCTURE AND METHOD FOR FABRICATING THE SAME

CROSS-REFERENCE TO RELATED APPLICATIONS

The present application claims priority to Korean Patent Application No. 10-2021-0106594, filed on Aug. 12, 2021, which is incorporated herein by reference in its entirety.

BACKGROUND

1. Field

The present invention relates to a semiconductor device and a method for fabricating the same and, more particularly, to an interconnection structure, a semiconductor device including the interconnection structure, and methods for fabricating the interconnection structure and the semiconductor device having the interconnection structure.

2. Description of the Related Art

The integration degree of semiconductor devices is increasing along with increased demand for high performance, high speed and/or multi-functionality of semiconductor devices. With such a trend for highly integrated semiconductor devices, research on semiconductor layout design, especially on efficient routing of interconnections for connecting the various semiconductor elements, has been actively ongoing.

SUMMARY

Various embodiments of the present invention improve the integration degree of semiconductor devices by simultaneously forming interconnections extending in various directions. The interconnections may be formed extending in various directions through a single gap-fill process. Various embodiments of the present invention provide an interconnection structure that is capable of simplifying semiconductor processing, a semiconductor device including the interconnection structure, and a method for fabricating the interconnection structure and the semiconductor device including the interconnection structure.

According to an embodiment of the present invention, an interconnection structure comprises: a stack of a plurality of interconnections, wherein at least two layers of the plurality of interconnections extend in different directions, and a portion of a top surface of a lower interconnection of the at least two layers is in direct contact with a portion of a bottom surface of an upper interconnection of the at least two layers.

According to an embodiment of the present invention, a semiconductor device comprises: a first interconnection formed over a substrate and extending in a first direction; a first contact connecting the first interconnection and the substrate; and a second interconnection in direct contact with a portion of the first interconnection and extending in a second direction which is different from the first direction.

According to an embodiment of the present invention, a semiconductor device comprises: a first interconnection formed over a substrate and extending in a first direction; a first contact connecting the first interconnection and the substrate; a second interconnection formed over the first interconnection and extending in a second direction; a second contact connecting the first and second interconnections; and a third interconnection formed over the second interconnection, in direct contact with a portion of the second interconnection, and extending in a third direction which is different from the second direction.

According to an embodiment of the present invention, a method for fabricating a semiconductor device comprises: forming a dielectric layer over a substrate; forming a first trench extending in a first direction by etching the dielectric layer; forming a second trench extending in a second direction crossing the first direction and having a bottom surface located at an upper level than a bottom surface of the first trench; and forming a conductive material gap-filling the first trench and the second trench.

The present invention may improve the integration degree of semiconductor devices by improving the interconnection structure. As a result, semiconductor processing may be simplified.

DETAILED DESCRIPTION

Figure 1:
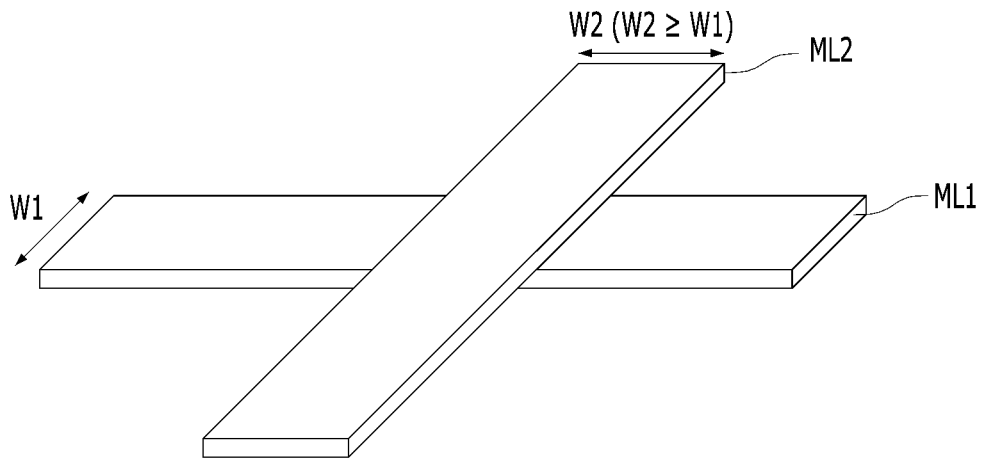
FIGS. 1 to 7 are perspective views illustrating interconnection structures according to embodiments of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention. Sizes and relative sizes of components indicated in the drawings may be exaggerated for clarity of description. Like reference numerals refer to like elements throughout, and "and/or" includes each and every combination of one or more of the recited items.

In addition, in the present specification, when a member is positioned "on" another member, this includes not only the case where the member is in contact with the other member, but also the case where another member exists between the two members. The terminology used herein is for the purpose of describing the embodiments and is not intended to limit the present invention. In this specification, the singular also includes the plural unless specifically stated otherwise in the phrase.

FIGS. 1 to 7 are perspective views illustrating interconnection structures according to embodiments of the present invention.

The interconnection structures may correspond to an upper interconnection and a lower interconnection adjacent to an interconnection selected from among first to nth interconnections which correspond to interconnection means of the semiconductor integrated circuit device. The interconnection structures may be formed on the substrate including a substructure, and the lowest interconnection of the interconnection structure may directly contact the substrate or one end of a contact for electrically connecting the substructure and the interconnection structure. Also, an uppermost interconnection of the interconnection structure may directly contact one end of a contact for electrically connecting a pad for applying a voltage or a ground to the interconnection structure.

Referring to FIG. 1, the interconnection structure may include a first interconnection ML1 and a second interconnection ML2 which extend in different directions from each other.

The first interconnection ML1 may extend in a first direction. The second interconnection ML2 may extend in a second direction. The first and second directions may indicate different directions. The first and second directions may cross each other. For example, the first and second directions may perpendicularly cross each other.

The second interconnection ML2 may directly contact with a portion of the first interconnection ML1. A top surface of the first interconnection ML1 may be at the same level as a bottom surface of the second interconnection ML2.

A line width W2 of the second interconnection ML2 may be the same as or greater than a line width W1 of the first interconnection ML1.

The first and second interconnections ML1 and ML2 may be formed of the same material. The first and second interconnections ML1 and ML2 may be simultaneously formed through a single gap-fill process.

Figure 2:
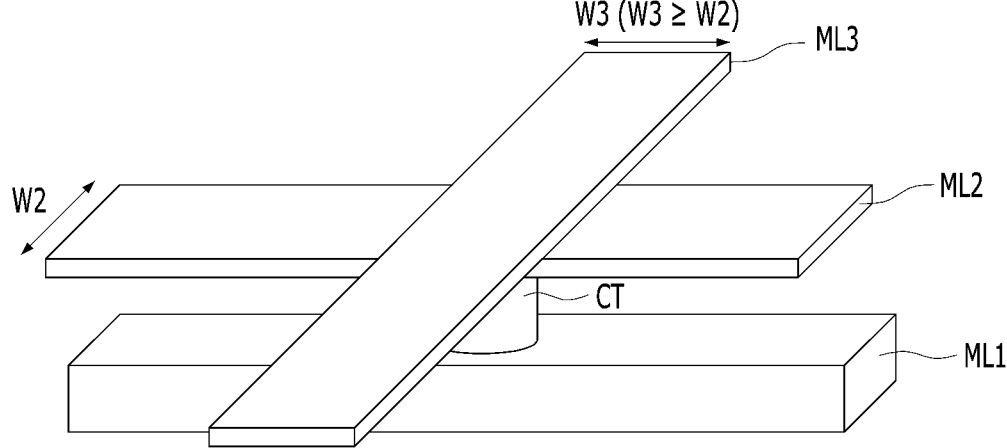

Referring to FIG. 2, an interconnection structure according to an embodiment of the present invention may include a first interconnection ML1, a second interconnection ML2, and a third interconnection ML3. The second and third interconnections ML2 and ML3 are formed on the first interconnection ML1 and extend in different directions from each other.

The first interconnection ML1 may extend in a first direction. The second interconnection ML2 may extend in a second direction. The first and second directions may indicate the same direction. The first and second directions may indicate different directions. The first interconnection ML1 and the second interconnection ML2 may be electrically connected via a contact CT. Both ends of the contact CT may be directly in contact with the first and second interconnections ML1 and ML2, respectively.

The third interconnection ML3 may extend in a third direction. The third and second directions may indicate different directions. The third and second directions may cross each other. For example, the third and second directions may perpendicularly cross each other.

The third interconnection ML3 may directly contact a portion of the second interconnection ML2. A top surface of the second interconnection ML2 may be at the same level as a bottom surface of the third interconnection ML3.

A line width W3 of the third interconnection ML3 may be the same as or greater than a line width W2 of the second interconnection ML2.

Thicknesses of the second and third interconnections ML2 and ML3 may be smaller than a thickness of the first interconnection ML1.

The first and third interconnections ML1 and ML3 may be formed of the same material. The first and second interconnections ML1 and ML2 may be respectively formed through separate gap-fill processes. The second and third interconnections ML2 and ML3 may be simultaneously formed through a single gap-fill process.

Figure 3:
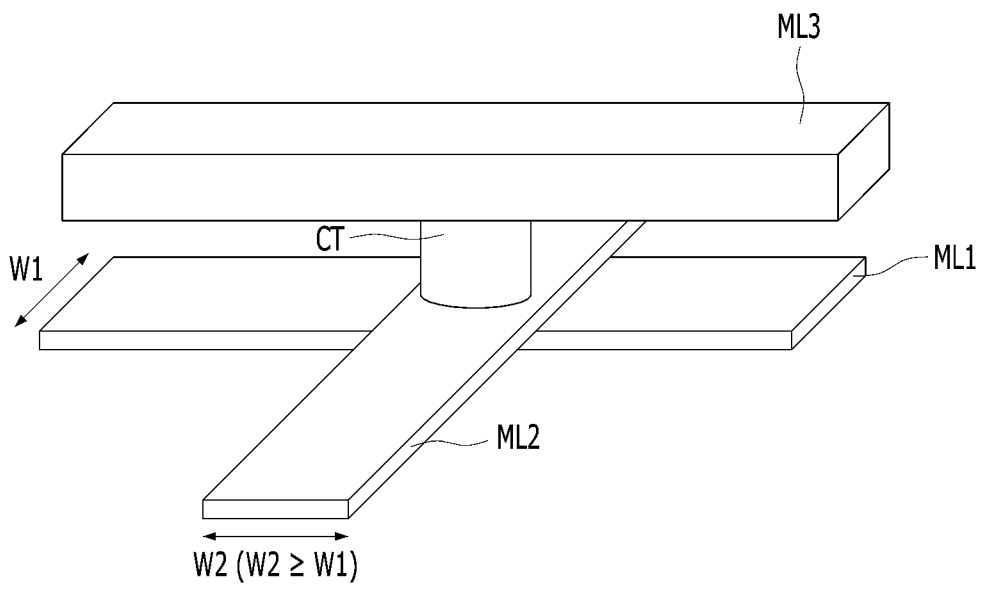

Referring to FIG. 3, an interconnection structure according to an embodiment of the present invention may include first and second interconnections ML1 and ML2 extending in different directions and a third interconnection ML3 formed on the second interconnection ML2.

The first interconnection ML1 may extend in a first direction. The second interconnection ML2 may extend in a second direction. The second and first directions may indicate different directions. The second and first directions may cross each other. For example, the second and first directions may perpendicularly cross each other.

The second interconnection ML2 may directly contact a portion of the first interconnection ML1. A top surface of the first interconnection ML1 may be at the same level as a bottom surface of the second interconnection ML2.

A line width W2 of the second interconnection ML2 may be the same as or greater than a line width W1 of the first interconnection ML1.

The third interconnection ML3 may extend in a third direction. The third and second directions may indicate different directions. The third and second directions may indicate the same direction. The third and second interconnections ML3 and ML2 may be electrically connected via a contact CT. Both ends of the contact CT may be directly in contact with the second and third interconnections ML2 and ML3, respectively.

Thicknesses of the first and second interconnections ML1 and ML2 may be smaller than a thickness of the third interconnection ML3.

The first and third interconnection ML1 and ML3 may be formed of the same material. The first and second interconnections ML1 and ML2 may be simultaneously formed through a single gap-fill process. The second and third interconnections ML2 and ML3 may be respectively formed through separate gap-fill processes.

Figure 4:
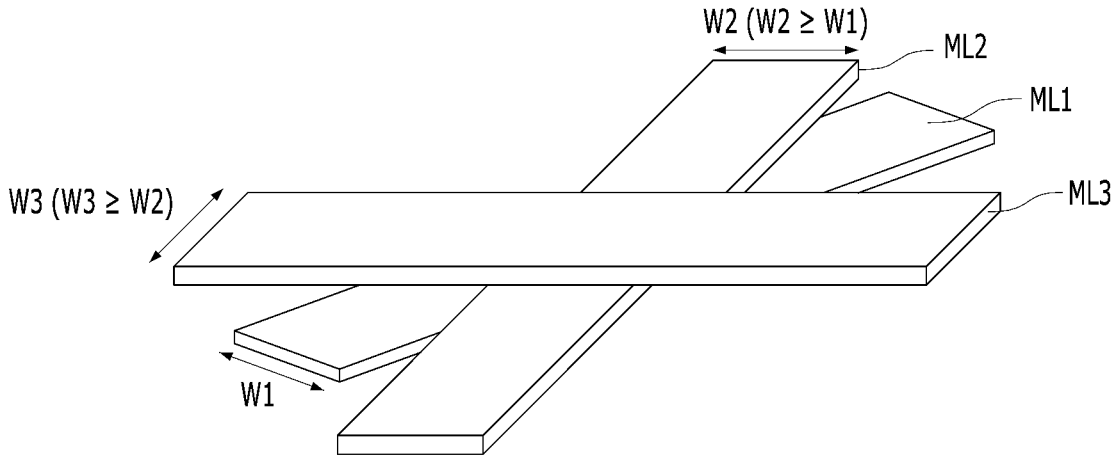

Referring to FIG. 4, an interconnection structure according to an embodiment of present invention may include first to third interconnections ML1 to ML3 extending in different directions.

The first interconnection ML1 may extend in a first direction. The second interconnection ML2 may extend in a second direction. The third interconnection ML3 may extend in a third direction. The second direction may indicate a direction different from the first direction. The second direction may intersect the first direction. The third direction may point to a direction different from the first and second directions. The third direction may intersect the second direction.

The second interconnection ML2 may directly contact a portion of the first interconnection ML1. A top surface of the first interconnection ML1 may be located at the same level as a bottom surface of the second interconnection ML2.

A line width W2 of the second interconnection ML2 may be the same as a line width W1 of the first interconnection ML1 or greater than the line width W1 of the first interconnection ML1.

The third interconnection ML3 may directly contact a portion of the second interconnection ML2. A top surface of the second interconnection ML2 may be located at the same level as a bottom surface of the third interconnection ML3.

A line width W3 of the third interconnection ML3 may be the same as the line width W2 of the second interconnection ML2 or greater than the line width W2 of the second interconnection ML2.

The first to third interconnections ML1 to ML3 may be formed of the same material. The first to third interconnections ML1 to ML3 may be simultaneously formed through a single gap-fill process.

Figure 5:
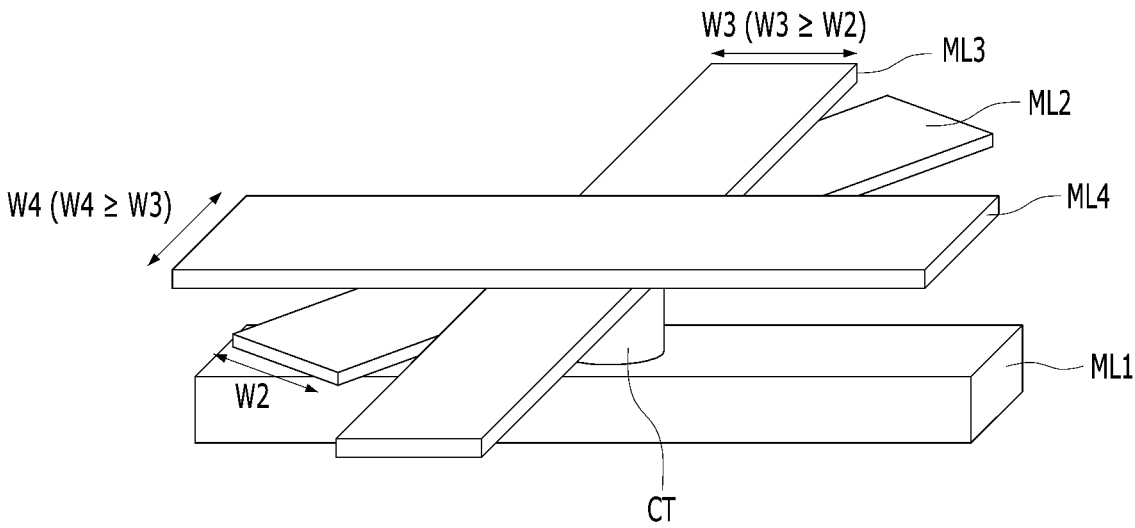

Referring to FIG. 5, an interconnection structure according to an embodiment of the present invention may include a first interconnection ML1 and second to fourth interconnections ML2 to ML4 which are formed on the first interconnection ML1 and extending in different directions from each other.

The first interconnection ML1 may extend in a first direction. The second interconnection ML2 may extend in a second direction. The second direction may indicate the same direction as the first direction. The second direction may indicate a direction different from the first direction. The first interconnection ML1 and the second interconnection ML2 may be electrically connected via a contact CT. Both ends of the contact CT may be in direct contact with the first interconnection ML1 and the second interconnection ML2.

The third interconnection ML3 may extend in a third direction. The fourth interconnection ML4 may extend in a fourth direction. The third direction may indicate a direction different from the second direction. The third direction may cross the second direction. The fourth direction may indicate a direction different from the second direction and the third direction. The fourth direction may cross the third direction.

The third interconnection ML3 may directly contact a portion of the second interconnection ML2. A top surface of the second interconnection ML2 may be located at the same level as a bottom surface of the third interconnection ML3.

A line width W3 of the third interconnection ML3 may be the same as a line width W2 of the second interconnection ML2 or greater than the line width W2 of the second interconnection ML2.

The fourth interconnection ML4 may directly contact a portion of the third interconnection ML3. A top surface of the third interconnection ML3 may be located at the same level as a bottom surface of the fourth interconnection ML4.

A line width W4 of the fourth interconnection ML4 may be the same as a line width W3 of the third interconnection ML3 or greater than the line width W3 of the third interconnection ML3.

Thicknesses of the second to fourth interconnections ML2 to ML4 may be smaller than a thickness of the first interconnection ML1.

The first to fourth interconnections ML1 to ML4 may be formed of the same material. The first interconnection ML1 and the second interconnection ML2 may be respectively formed through separate gap-fill processes. The second to fourth interconnections ML2 to ML4 may be simultaneously formed through a single gap-fill process.

Figure 6:
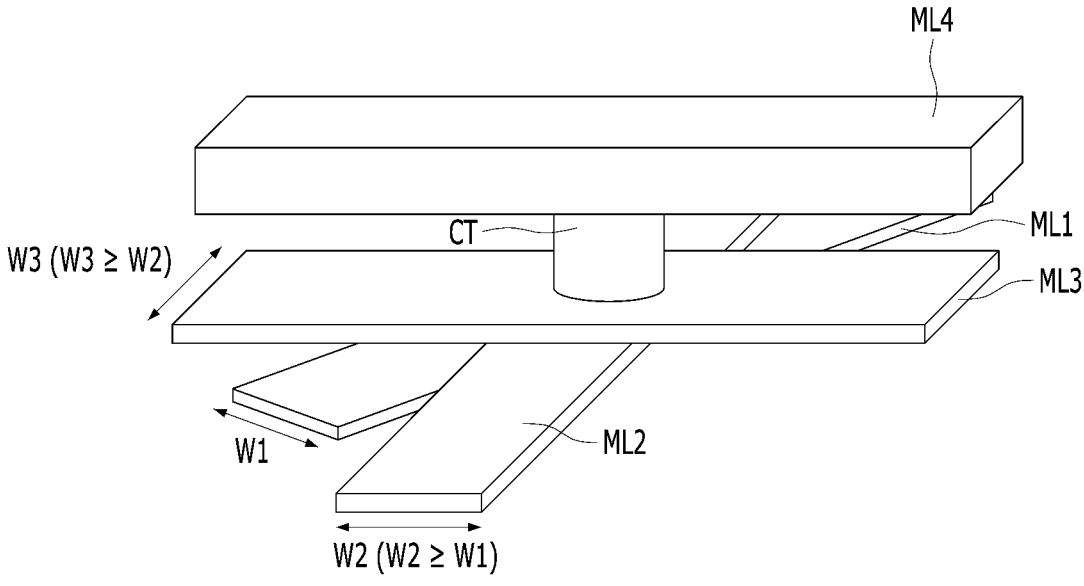

Referring to FIG. 6, an interconnection structure according to an embodiment of the present invention may include first to third interconnections ML1 to ML3 extending in different directions from each other and a fourth interconnection ML4 formed on the first to third interconnections ML1 to ML3.

The first interconnection ML1 may extend in a first direction. The second interconnection ML2 may extend in a second direction. The third interconnection ML3 may extend in a third direction. The second direction may indicate a direction different from the first direction. The second direction may cross the first direction. The third direction may indicate a direction different from the first to second directions. The third direction may cross the second direction.

The second interconnection ML2 may directly contact a portion of the first interconnection ML1. A top surface of the first interconnection ML1 may be located at the same level as a bottom surface of the second interconnection ML2.

A line width W2 of the second interconnection ML2 may be the same as a line width W1 of the first interconnection ML1 or greater than the line width W1 of the first interconnection ML1.

The third interconnection ML3 may directly contact a portion of the second interconnection ML2. A top surface of the second interconnection ML2 may be located at the same level as a bottom surface of the third interconnection ML3.

A line width W3 of the third interconnection ML3 may be the same as the line width W2 of the second interconnection ML2 or greater than the line width W2 of the second interconnection ML2.

The fourth interconnection ML4 may extend in the fourth direction. The fourth direction may indicate the same direction as the third direction. The fourth interconnection ML4 and the third interconnection ML3 may be electrically connected via a contact CT. Both ends of the contact CT may be respectively in direct contact with the third interconnection ML3 and the fourth interconnection ML4.

Thicknesses of the first to third interconnections ML1 to ML3 may be smaller than a thickness of the fourth interconnection ML4.

The first to fourth interconnections ML1 to ML4 may be formed of the same material. The first to third interconnections ML1 to ML3 may be simultaneously formed through a single gap-fill process. The third interconnection ML3 and the fourth interconnection ML4 may be respectively formed through separate gap-fill processes.

Figure 7:
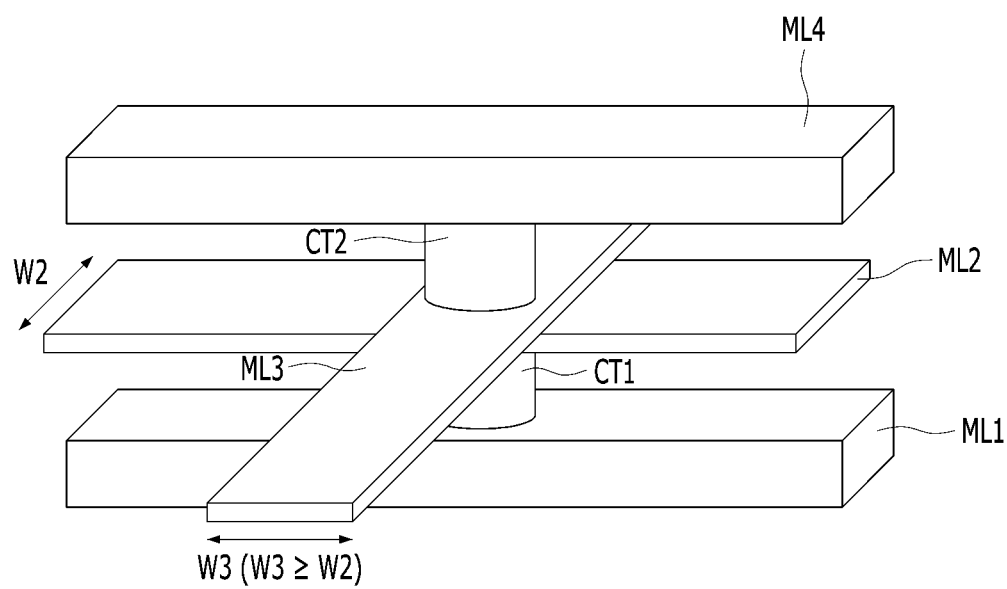

Referring to FIG. 7, a semiconductor device according to an embodiment of the present invention may include a first interconnection ML1, a second interconnection ML2, and a third interconnection ML3 extending in different directions from each other. The second interconnection ML2 may be formed on the first interconnection ML1. A fourth interconnection ML4 may be formed on the third interconnection ML3.

The first interconnection ML1 may extend in a first direction. The second interconnection ML2 may extend in a second direction. The second direction may indicate the same direction as the first direction. The second direction may indicate a direction different from the first direction. The first interconnection ML1 and the second interconnection ML2 may be electrically connected via a first contact CT1. Both ends of the first contact CT1 may be respectively in direct contact with the first interconnection ML1 and the second interconnection ML2.

The third interconnection ML3 may extend in a third direction. The third direction may indicate a direction different from the second direction. The third direction may cross the second direction. For example, the third direction may perpendicularly cross the second direction.

The third interconnection ML3 may directly contact a portion of the second interconnection ML2. A top surface of the second interconnection ML2 may be located at the same level as a bottom surface of the third interconnection ML3.

A line width W3 of the third interconnection ML3 may be the same as a line width W2 of the second interconnection ML2 or greater than the line width W2 of the second interconnection ML2.

The fourth interconnection ML4 may extend in a fourth direction. The fourth direction may indicate a direction different from the third direction. The fourth direction may refer to the same direction as the third direction. The fourth interconnection ML4 and the third interconnection ML3 may be electrically connected via a second contact CT2. Both ends of the second contact CT2 may be respectively in direct contact with the third interconnection ML3 and the fourth interconnection ML4.

Thicknesses of the second interconnection ML2 and the third interconnection ML3 may be smaller than thicknesses of the first interconnection ML1 and the fourth interconnection ML4.

The first to fourth interconnections ML1 to ML4 may be formed of the same material. The first interconnection ML1 and the second interconnection ML2 may be respectively formed through separate gap-fill processes. The second interconnection ML2 to the third interconnection ML3 may be simultaneously formed through a single gap-fill process. The third interconnection ML3 and the fourth interconnection ML4 may be respectively formed through separate gap-fill processes.

Although the semiconductor devices according to the above described embodiments include an interconnection structure having two to four layers, the present invention is not limited thereto. The interconnection structure according to an embodiment of the present invention may include a multi-layered interconnection structure in which a plurality of interconnections including two or more layers are stacked. The interconnection structure according to an embodiment of the present invention may include at least two adjacent interconnections which extend in different directions and directly contact each other. In addition, the interconnection structure simultaneously formed through a single gap-fill process may have four or more layers.

As described above, an embodiment of the present invention includes a multi-layered interconnection structure in which a plurality of interconnections are stacked. By configuring at least two interconnection structures extending in different directions and in direct contact with each other, the integration degree of semiconductor devices can be increased. In addition, a process margin may be secured by simultaneously forming at least two interconnection structures through a single gap-fill process.

FIGS. 8A to 17A and FIGS. 8B to 17B are plan views and cross-sectional views, respectively, illustrating a method of fabricating a semiconductor device according to an embodiment of the present invention. FIG. 18 is a cross-sectional view illustrating a semiconductor device according to an embodiment of the present invention. FIGS. 8A to 18 are diagrams illustrating a method of fabricating a semiconductor device including the interconnection structure shown in FIG. 2. FIGS. 8A to 17A are plan views, and FIGS. 8B to 17B are cross-sectional views taken along A-A' direction in FIGS. 8A to 17A. FIG. 18 is a cross-sectional view illustrating another embodiment of the present invention which is a variation from the embodiment of FIG. 17B.

Figure 8A:
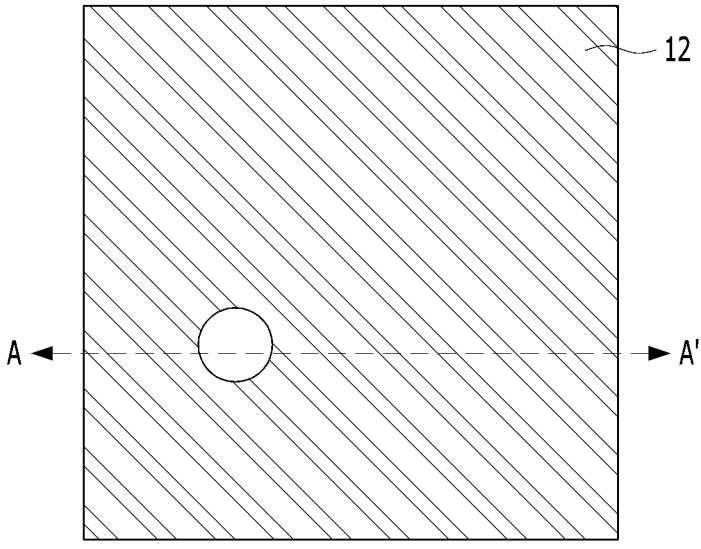
FIGS. 8A to 17B are plan views and cross-sectional views illustrating a method for fabricating a semiconductor device according to an embodiment of the present invention.
Figure 8B:
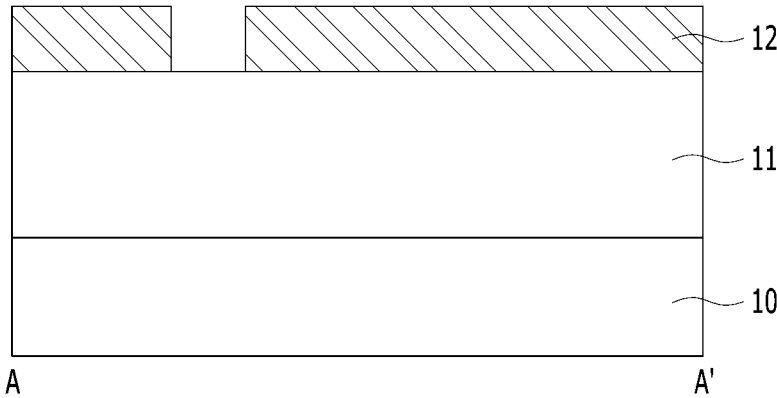
Figure 9A:
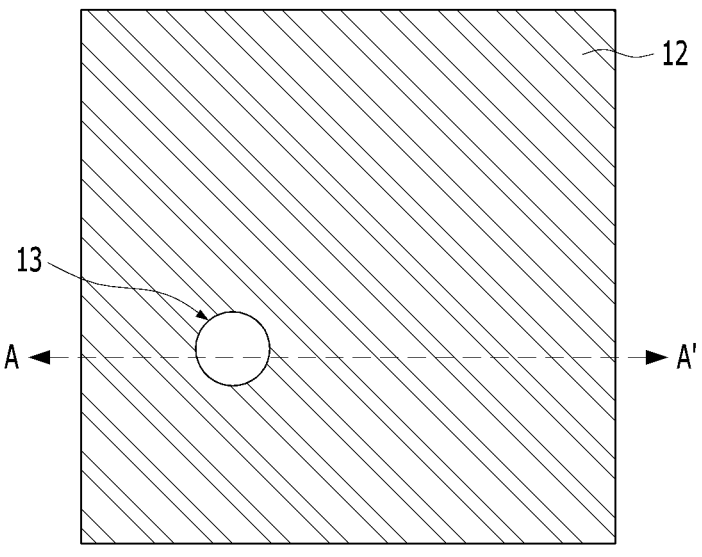
Figure 9B:
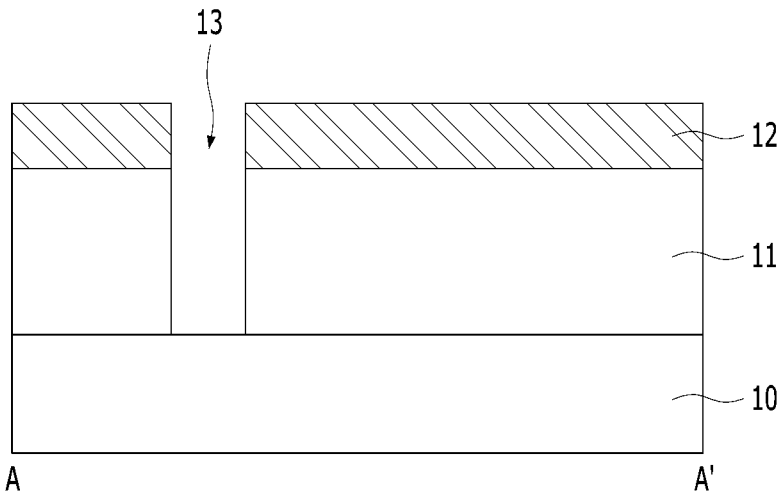
Figure 10A:
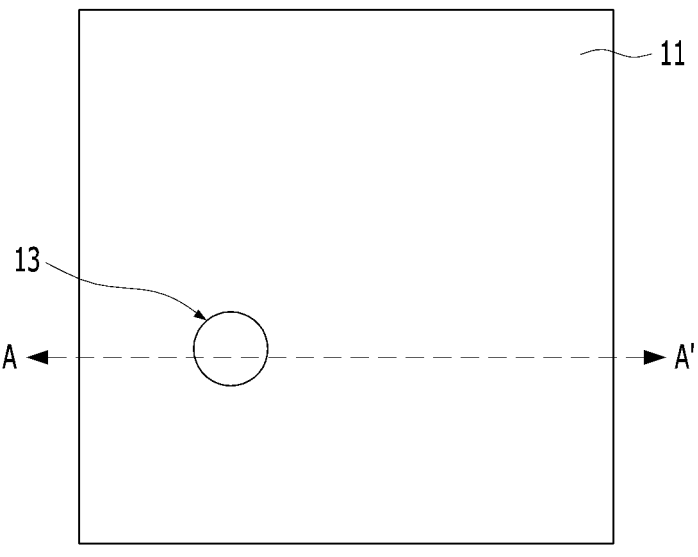
Figure 10B:
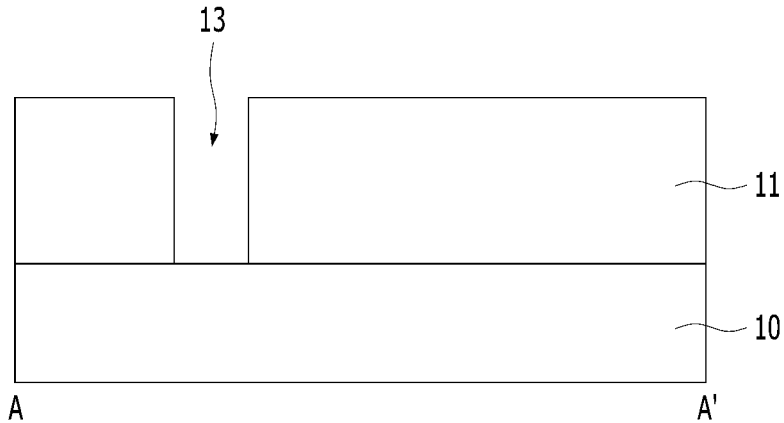

As shown in FIGS. 8A and 8B, a dielectric layer 11 may be formed on a semiconductor substrate 10 including a substructure. The substructure may include the first interconnection ML1 of FIG. 2.

The semiconductor substrate 10 may be a semiconductor substrate on which a substructure such as a gate, a bit line, and a capacitor is formed. The semiconductor substrate 10 may be made of a silicon-containing material. The semiconductor substrate 10 may include silicon, monocrystalline silicon, polysilicon, amorphous silicon, silicon germanium, monocrystalline silicon germanium, polycrystalline silicon germanium, carbon doped silicon, combinations thereof, or multilayers thereof. The semiconductor substrate 10 may include a III/V group semiconductor substrate, for example, a compound semiconductor substrate such as GaAs. The semiconductor substrate 10 may include a silicon on insulator (SOI) substrate.

The dielectric layer 11 may be applied for insulation between a substructure and the metal interconnection or between upper and lower metal interconnections. The dielectric layer 11 may be formed of one of silicon oxide, silicon nitride, or a low-k material including silicon carbon and boron. The dielectric layer 11 may include a dielectric material having a low dielectric constant (low-k dielectric). The dielectric layer 11 may include tetra ethyl ortho silicate (TEOS) oxide.

A first mask pattern 12 may be formed on the dielectric layer 11. The first mask pattern 12 may define a via region of a hole pattern. The first mask pattern 12 may include a photoresist. An anti-reflection layer may be formed between the first mask pattern 12 and the dielectric layer 11.

As shown in FIGS. 9A to 10B, a via 13 passing through the dielectric layer 11 may be formed. The via 13 may expose a portion of a substructure connected to the metal interconnection. The via 13 may be formed as a hole pattern. The via 13 may be a region for forming the contact CT of FIG. 2.

Subsequently, the first mask pattern 12 may be removed.

Figure 11A:
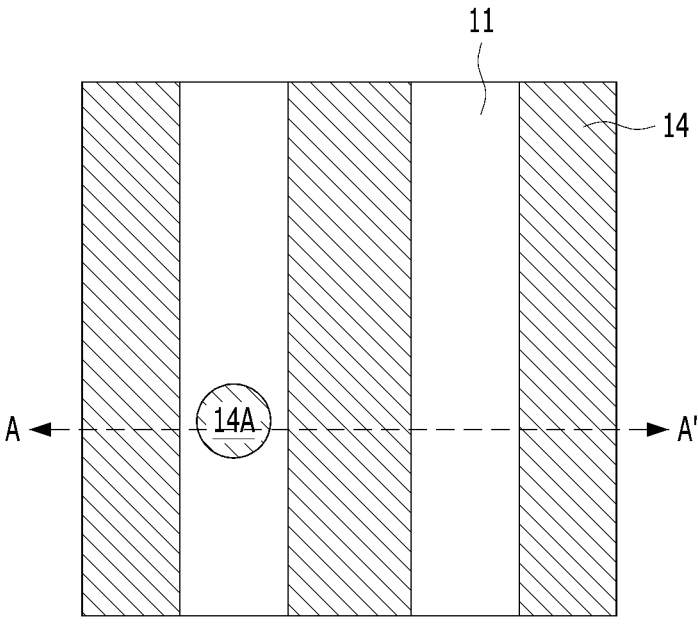
Figure 11B:
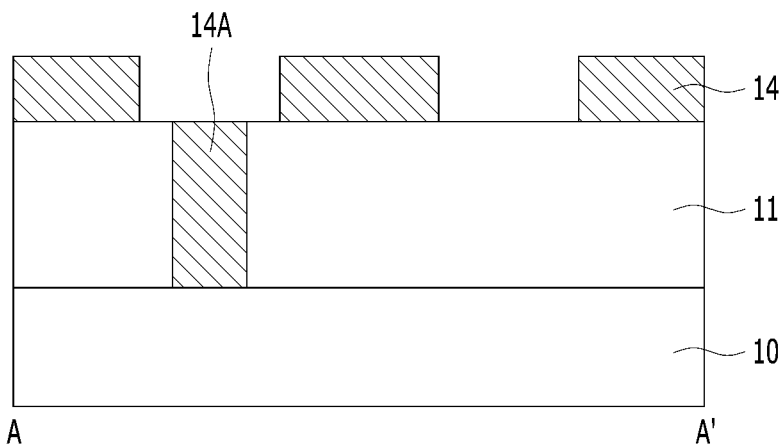
Figure 12A:
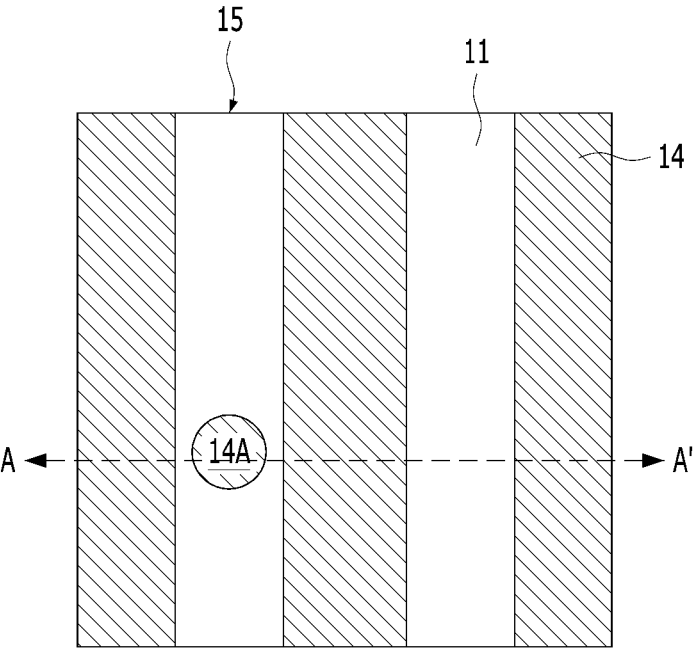
Figure 12B:
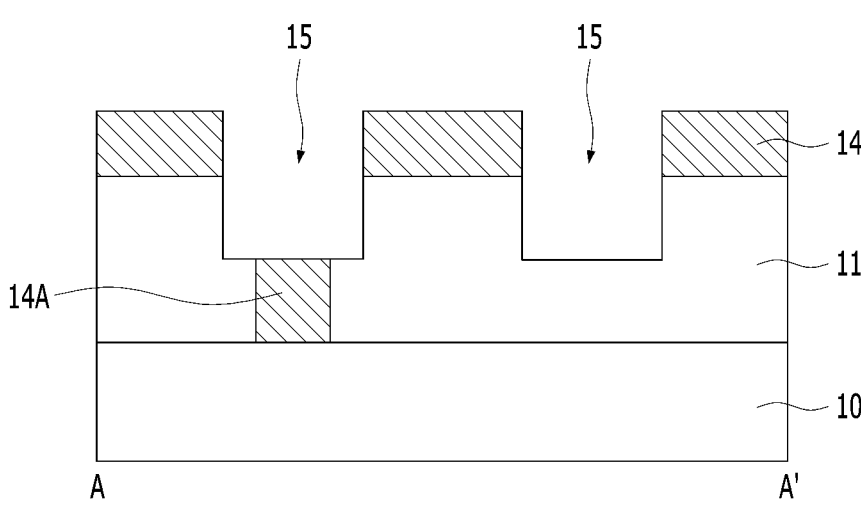
Figure 13A:
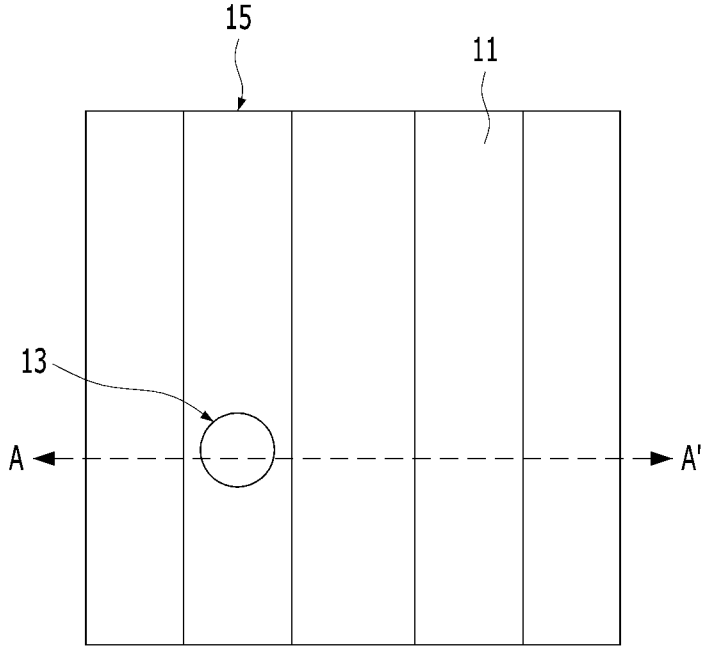
Figure 13B:
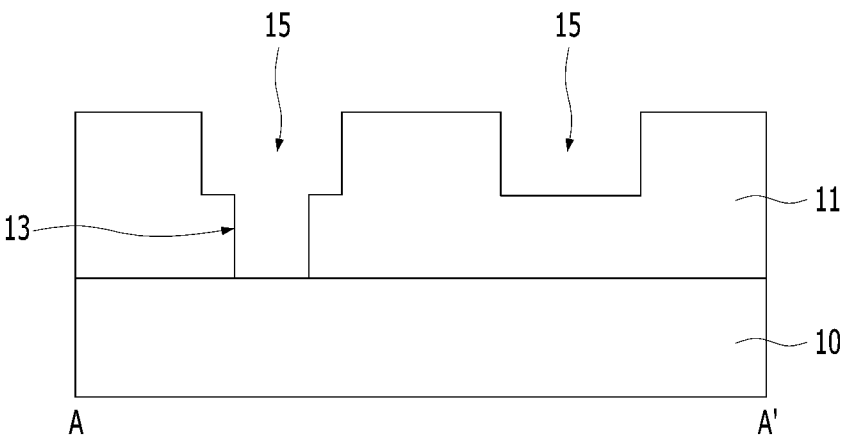

As shown in FIGS. 11A and 11B, a second mask pattern 14 may be formed on the dielectric layer 11. The second mask pattern 14 may define a trench region having a line width wider than that of the via 13. A portion of the region defined by the second mask pattern 14 may overlap the via 13. The second mask pattern 14 may include a photoresist. An anti-reflection layer may be formed between the second mask pattern 14 and the dielectric layer 11.

When the second mask pattern 14 is formed, the first sacrificial layer 14A may be gap-filled in the via 13. The first sacrificial layer 14A may be made of the same material as the second mask pattern 14. The first sacrificial layer 14A may serve as a protective layer to prevent damage to a substructure during a subsequent trench formation process.

As shown in FIGS. 12A to 13B, the dielectric layer 11 may be etched to a predetermined depth to form a plurality of first trenches 15 extending in a first direction and spaced apart from each other. The bottom surface of the first trench 15 may be located at a higher level than the bottom surface of the via 13. The first trench 15 may be a region for forming the second interconnection ML2 of FIG. 2.

Subsequently, the second mask pattern 14 may be removed. At this time, the first sacrificial layer 14A gap-filled in the via 13 may be removed together with the second mask pattern 14.

Figure 14A:
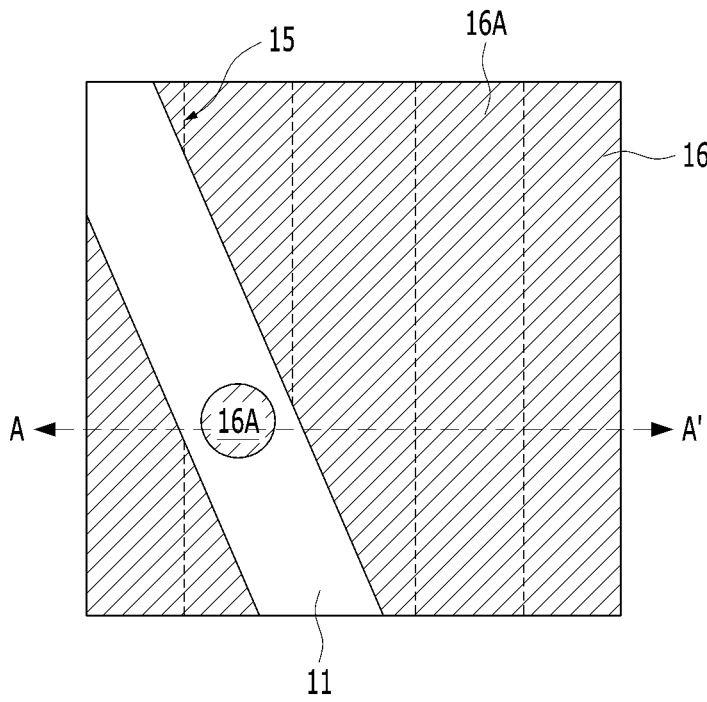
Figure 14B:
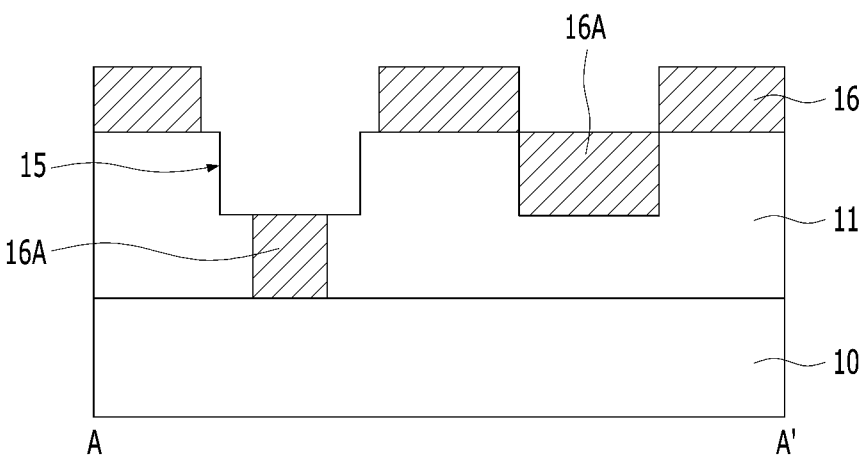
Figure 15A:
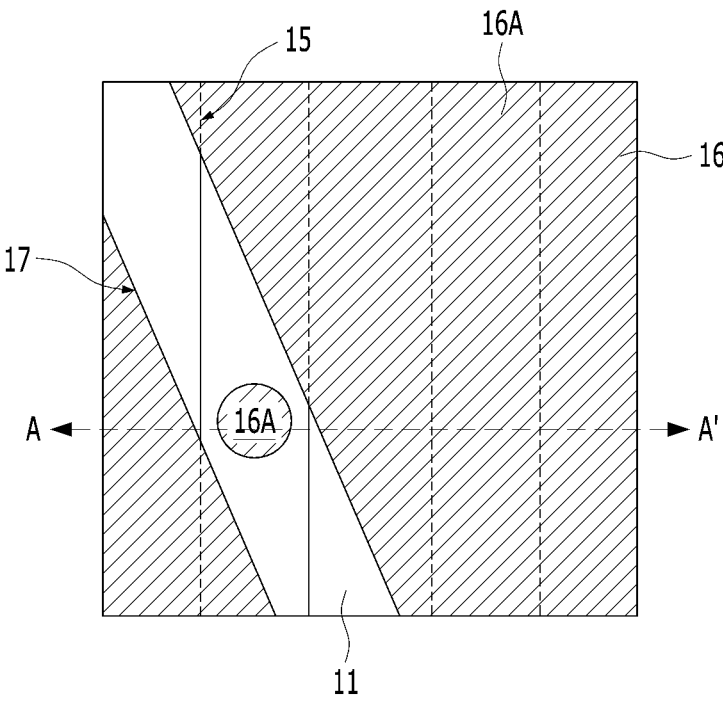
Figure 15B:
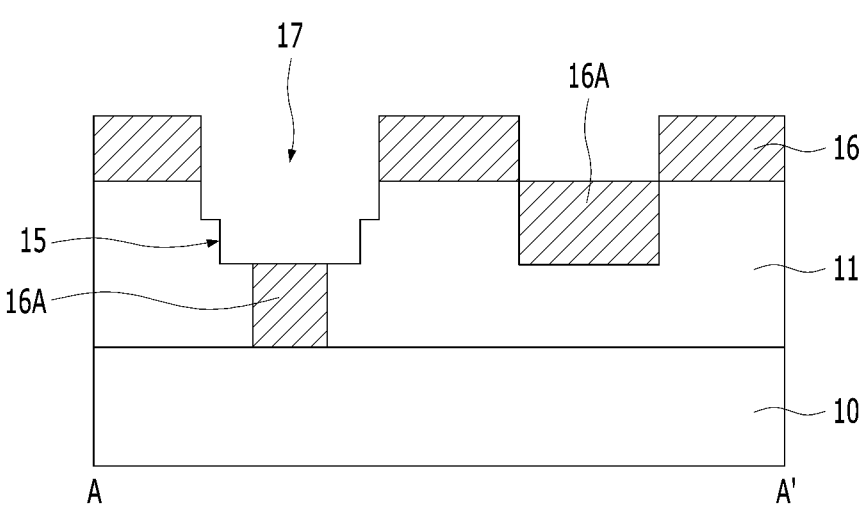
Figure 16A:
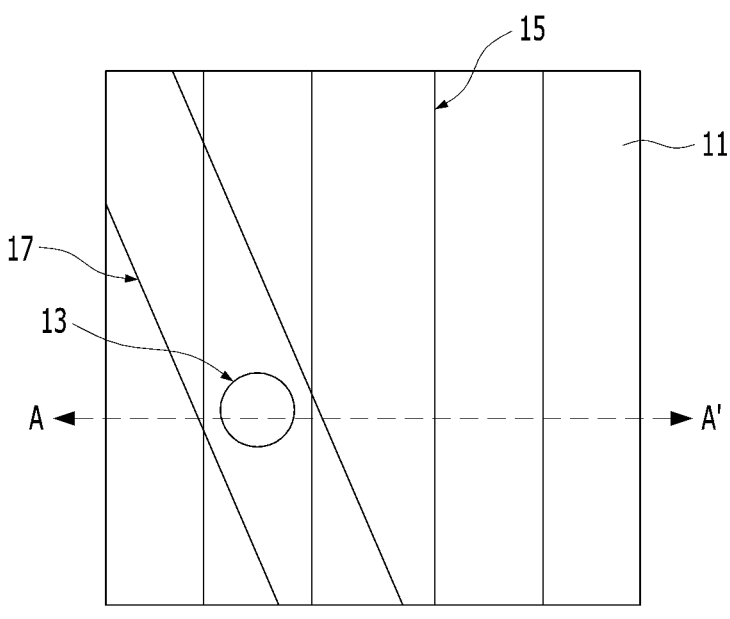
Figure 16B:
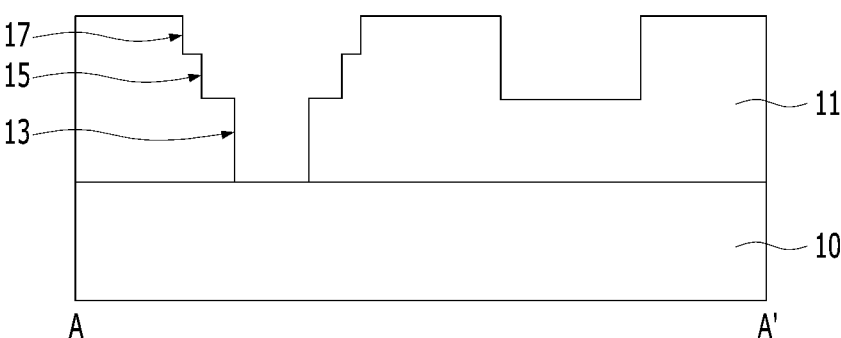

As shown in FIGS. 14A and 14B, a third mask pattern 16 may be formed on the dielectric layer 11. The third mask pattern 16 may define a second trench region having a line width wider than that of the first trench 15. In another embodiment, the second trench region defined by the third mask pattern 16 may have the same line width as the first trench 15.

A portion of the second trench region defined by the third mask pattern 16 may overlap a portion of the first trench 15. The third mask pattern 16 may include a photoresist. An anti-reflection layer may be formed between the third mask pattern 16 and the dielectric layer 11.

When the third mask pattern 16 is formed, the second sacrificial layer 16A may be gap-filled in the via 13 and some of the first trenches 15. The second sacrificial layer 16A may be made of the same material as the third mask pattern 16. The second sacrificial layer 16A may serve to prevent damage to a substructure during a subsequent trench formation process and to protect some of the first trenches 15 in which the second trenches are not formed.

As shown in FIGS. 15A to 16B, the dielectric layer 11 may be etched to a predetermined depth to form a second trench 17 extending in the second direction. The bottom surface of the second trench 17 may be located at a higher level than the bottom surface of the first trench 15. The second trench 17 may be a region for forming the third interconnection ML3 of FIG. 2.

Subsequently, the third mask pattern 16 may be removed. In this case, the second sacrificial layer 16A gap-filled in the via 13 and the first trench 15 may be removed together with the third mask pattern 16.

Figure 17A:
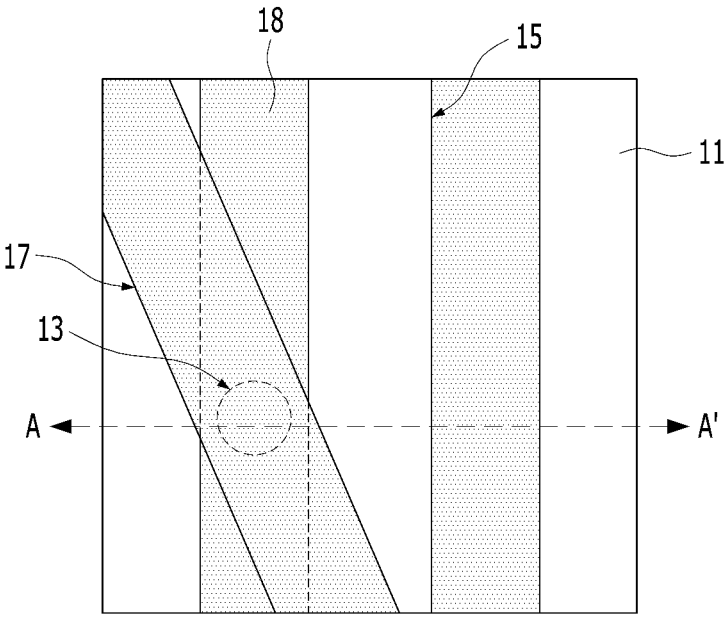
Figure 17B:
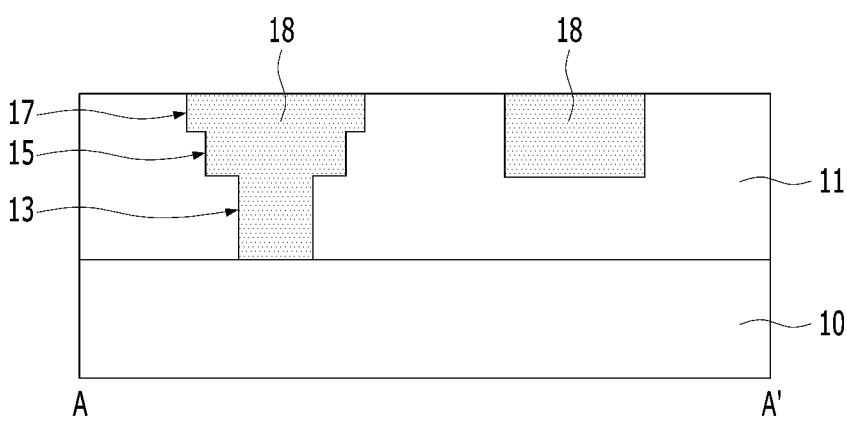
Figure 18:
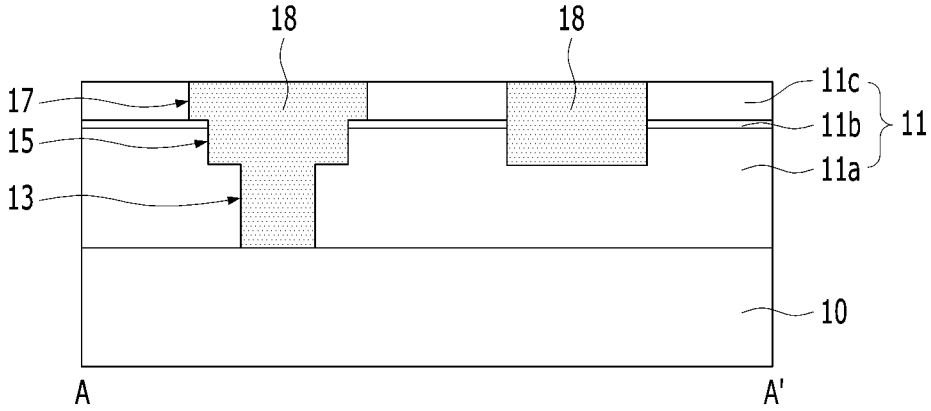
FIG. 18 is a cross-sectional view illustrating a semiconductor device according to another embodiment of the present invention.

As shown in FIGS. 17A and 17B, an interconnection 18 may be formed by gap-filling a conductive material in the via 13, the first trench 15, and the second trench 17. The interconnection 18 may refer to the third interconnection ML3 of FIG. 2. The conductive material buried in the via 13, the first trench 15, and the second trench 17 may correspond to the contact CT, the second interconnection ML2, and the third interconnection ML4, respectively, shown in FIG. 2.

The interconnection 18 may be formed through a series of process of forming a barrier layer on the entire surface of the dielectric layer 11 including the via 13, the first trench 15 and the second trench 17, forming the conductive material filling the via 13, the first trench 15, and the second trench 17, and then etching the conductive material and the barrier layer to expose the top surface of the dielectric layer 11. In this case, the process of etching the conductive material and the barrier layer may be performed by a chemical mechanical polishing (CMP) process or an etch back process.

The barrier layer may serve to prevent diffusion of the material used for the interconnection 18 in the substrate 10. The barrier layer may be formed of at least one material selected from the group consisting of Ta, TaN, TiN, WN, and W—Si—N. The interconnection 18 may include tungsten, copper, or aluminum.

Although this embodiment shows a method for fabricating the second and third interconnections, the process shown in FIGS. 14A to 16B may be repeated to simultaneously form a fourth or more interconnections through a single gap-fill process.

In this embodiment, the first and second trenches 15 and 17 having different depths are formed in the dielectric layer 11 of a single layer, but as shown in FIG. 18, the dielectric layer 11 may be multilayered including dielectric layers 11a and 11c with an etch stop layer 11b interposed therebetween. The etch stop layer 11b interposed between the dielectric layers 11a and 11c may be applied as an etch stop layer for each trench.

In particular in an embodiment of the present invention, semiconductor processing may be simplified by applying a damascene process that forms trenches extending in different directions and having different depths and by forming interconnections through a single gap fill process.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor device comprising:
a first interconnection extending in a first direction over a substrate;
a first contact connecting the first interconnection and the substrate;

a second interconnection formed over the first interconnection, in direct contact with a portion of the first interconnection and extending in a second direction which is different from the first direction;
a third interconnection formed over the second interconnection and extending in a third direction which is different from the first and second directions; and
a second contact of which both ends are in direct contact with the second interconnection and the third interconnection,
wherein the first contact is vertically aligned with the second contact,
wherein a top surface of the first interconnection and a bottom surface of the second interconnection are located at a same level,
wherein the sidewalls of the first and second contacts are vertically aligned in a cross-sectional view, and
wherein the vertical alignment of the sidewalls of the first and second contacts reduces parasitic capacitance and improves signal integrity.

2. The semiconductor device of claim 1, wherein a line width of the second interconnection is the same as a line width of the first interconnection or greater than the line width of the first interconnection.

3. The semiconductor device of claim 1, wherein the third interconnection is formed in direct contact with a portion of the second interconnection.

4. The semiconductor device of claim 3, wherein a top surface of the second interconnection and a bottom surface of the third interconnection are located at a same level.

5. The semiconductor device of claim 3, wherein a line width of the third interconnection is the same as a line width of the second interconnection or greater than the line width of the second interconnection.

6. The semiconductor device of claim 1, wherein a top surface of the second interconnection is located at a lower level than a bottom surface of the third interconnection.

7. A semiconductor device comprising:
a first interconnection formed over a substrate and extending in a first direction;
a first contact connecting the first interconnection and the substrate;
a second interconnection formed over the first interconnection and extending in a second direction;
a second contact connecting the first and second interconnections; and
a third interconnection formed over the second interconnection, in direct contact with a portion of the second interconnection, and extending in a third direction which is different from the first and second directions,
wherein the first contact is vertically aligned with the second contact,
wherein a top surface of the first interconnection and a bottom surface of the second interconnection are located at a same level,
wherein the sidewalls of the first and second contacts are vertically aligned in a cross-sectional view, and
wherein the vertical alignment of the first and second contacts reduces parasitic capacitance and improves signal integrity.

8. The semiconductor device of claim 7, wherein a line width of the third interconnection is the same as a line width of the second interconnection or greater than the line width of the second interconnection.

9. The semiconductor device of claim 7, wherein thicknesses of the second and third interconnections are smaller than a thickness of the first interconnection.

10. The semiconductor device of claim 7, further including a fourth interconnection formed over the third interconnection, in direct contact with a portion of the third interconnection, and extending in a fourth direction which is different from the third direction.

11. The semiconductor device of claim 10, wherein a top surface of the third interconnection and a bottom surface of the fourth interconnection are located at a same level.

12. The semiconductor device of claim 10, wherein a line width of the fourth interconnection is the same as a line width of the third interconnection or greater than the line width of the third interconnection.

13. The semiconductor device of claim 10, wherein a line width of the fourth interconnection is smaller than a line width of the first interconnection.

14. The semiconductor device of claim 7, further including:

a fourth interconnection formed over the third interconnection and extending in a fourth direction; and a third contact of which both ends are in direct contact with the third and fourth interconnections.

* * * * *